US009871011B2

(12) United States Patent
Kim et al.

(10) Patent No.: US 9,871,011 B2
(45) Date of Patent: Jan. 16, 2018

(54) SEMICONDUCTOR PACKAGE USING A CONTACT IN A PLEATED SIDEWALL ENCAPSULANT OPENING

(71) Applicant: Amkor Technology, Inc., Tempe, AZ (US)

(72) Inventors: Jae Yun Kim, Seoul (KR); Tae Kyung Hwang, Seoul (KR); Jin Han Kim, Gyeonggi-do (KR); Jong Sik Paek, Incheon (KR); Kyoung Rock Kim, Gyeonggi-do (KR); Byong Jin Kim, Gyeonggi-do (KR); Jae Beum Shim, Incheon (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/018,635

(22) Filed: Feb. 8, 2016

(65) Prior Publication Data

US 2016/0233187 A1     Aug. 11, 2016

(30) Foreign Application Priority Data

Feb. 9, 2015    (KR) .......................... 10-2015-0019459

(51) Int. Cl.
*H01L 29/49* (2006.01)
*H01L 23/00* (2006.01)
*H01L 23/31* (2006.01)

(52) U.S. Cl.
CPC .......... *H01L 24/13* (2013.01); *H01L 23/3114* (2013.01); *H01L 24/06* (2013.01); *H01L 24/11* (2013.01); *H01L 2224/0231* (2013.01); *H01L 2224/0401* (2013.01); *H01L 2224/05024* (2013.01); *H01L 2224/1146* (2013.01); *H01L 2224/12105* (2013.01); *H01L 2224/13017* (2013.01); *H01L 2224/13022* (2013.01); *H01L 2224/13082* (2013.01); *H01L 2224/32225* (2013.01); *H01L 2224/73267* (2013.01); *H01L 2924/15153* (2013.01); *H01L 2924/18162* (2013.01)

(58) Field of Classification Search
CPC ..... H01L 24/13; H01L 23/3114; H01L 24/06; H01L 24/11
See application file for complete search history.

(56) References Cited

U.S. PATENT DOCUMENTS

| 8,304,896 | B2 | 11/2012 | England |
| 9,466,580 | B2 * | 10/2016 | Paek ........................ H01L 24/05 |
| 2009/0166859 | A1 | 7/2009 | Yuan et al. |

(Continued)

FOREIGN PATENT DOCUMENTS

| KR | 20090070916 A | 7/2009 |
| KR | 10-2014-0021149 A | 2/2014 |

OTHER PUBLICATIONS

Korean Office Action for 10-2015-0019459 dated Dec. 1, 2015.

*Primary Examiner* — Michael Shingleton
(74) *Attorney, Agent, or Firm* — McAndrews, Held & Malloy, Ltd.

(57) ABSTRACT

A semiconductor package, and a method of manufacturing thereof, comprising a contact in a plated sidewall encapsulant opening, substantially as shown in and/or described in connection with at least one of the figures, as set forth more completely in the claims.

21 Claims, 7 Drawing Sheets

(56) References Cited

U.S. PATENT DOCUMENTS

| | | | |
|---|---|---|---|
| 2011/0298101 A1* | 12/2011 | Pagaila | H01L 21/561 |
| | | | 257/659 |
| 2012/0241952 A1 | 9/2012 | Harries et al. | |
| 2013/0147033 A1* | 6/2013 | Chen | H01L 23/3114 |
| | | | 257/737 |
| 2014/0042600 A1 | 2/2014 | Kim et al. | |
| 2016/0141213 A1* | 5/2016 | Bishop | H01L 24/19 |
| | | | 438/16 |
| 2016/0276237 A1* | 9/2016 | Lin | H01L 23/49816 |
| 2016/0284657 A1* | 9/2016 | Han | H01L 24/13 |

* cited by examiner

FIG. 4E
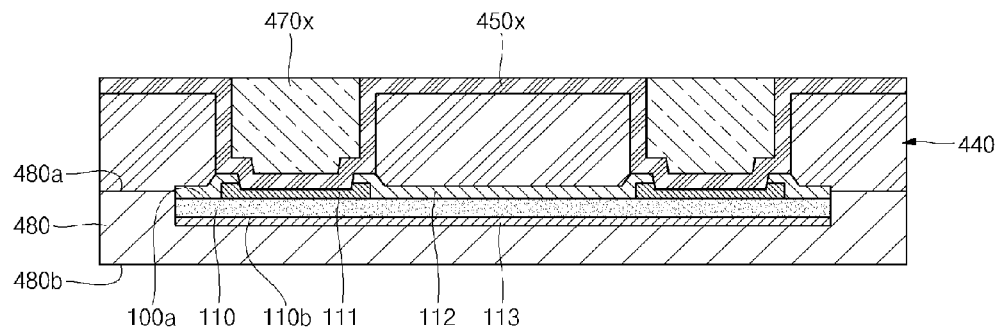
FIG. 4F
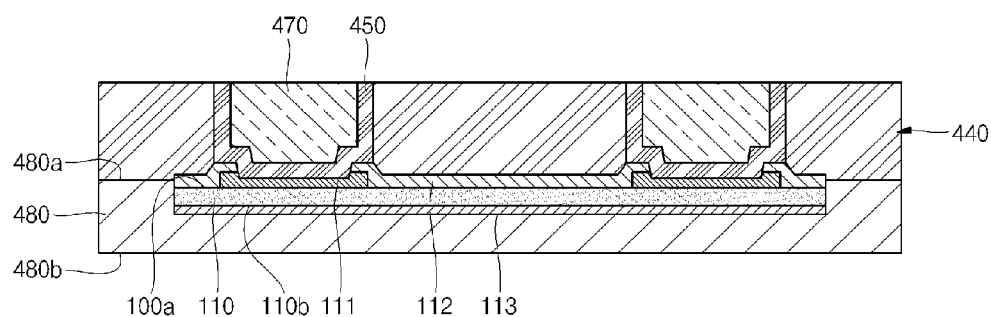
FIG. 4G
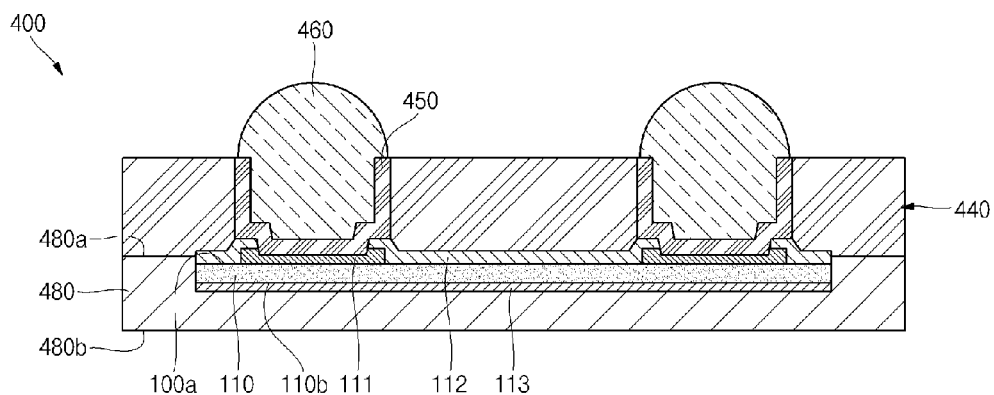
FIG. 4E-4G

SEMICONDUCTOR PACKAGE USING A CONTACT IN A PLEATED SIDEWALL ENCAPSULANT OPENING

CROSS REFERENCE TO RELATED APPLICATIONS

The present application makes reference to, claims priority to, and claims the benefit of Korean Patent Application No. 10-2015-0019459, filed on Feb. 9, 2015, the contents of which are hereby incorporated herein by reference, in their entirety.

FIELD

Certain example embodiments of the disclosure relate to semiconductor chip packaging. More specifically, certain example embodiments of the disclosure relate to a semiconductor package using a contact in a plated sidewall encapsulant opening.

BACKGROUND

Due to demand for miniaturized, highly functional electronic products in the semiconductor industry, a variety of techniques for providing high-capacity semiconductor packages are being researched and developed.

In general, since wafer level packages are packaged on a wafer level, packaging costs can be considerably reduced according to the number of semiconductor die produced for each wafer. However, when a stress buffer is removed (e.g., a substrate serving as a stress buffer), the wafer level packages have poor reliability compared to packages with the stress buffer in place.

Further limitations and disadvantages of conventional and traditional approaches will become apparent to one of skill in the art, through comparison of such systems with the present disclosure as set forth in the remainder of the present application with reference to the drawings.

BRIEF SUMMARY

Various aspects of this disclosure provide a semiconductor package, and a method of manufacturing thereof, comprising a contact in a plated sidewall encapsulant opening, substantially as shown in and/or described in connection with at least one of the figures, as set forth more completely in the claims.

Various advantages, aspects and novel features of the present disclosure, as well as details of various illustrated example supporting embodiments, will be more fully understood from the following description and drawings.

BRIEF DESCRIPTION OF SEVERAL VIEWS OF THE DRAWINGS

FIGS. 4A to 4G are views illustrating a method of manufacturing a semiconductor package according to still another embodiment of the present disclosure.

DETAILED DESCRIPTION

Figure 1A:
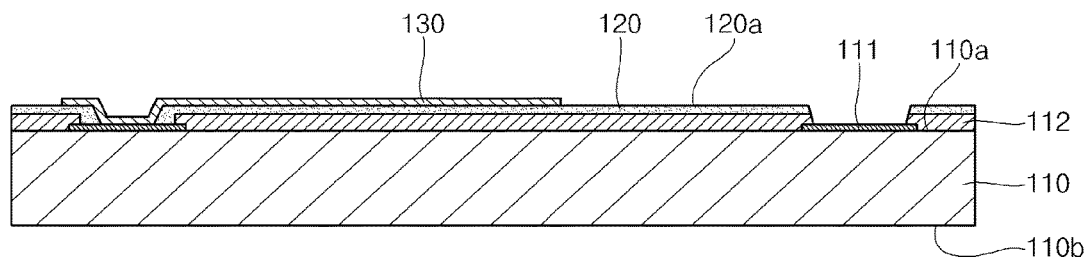
FIGS. 1A to 1F are views illustrating a method of manufacturing a semiconductor package according to an embodiment of the present disclosure.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated.

Certain aspects of the disclosure may be found in a semiconductor package comprising a contact in a plated sidewall encapsulant opening. Example aspects of the disclosure may comprise a semiconductor die comprising a first surface with a contact pad and a second surface opposite the first surface; a redistribution structure on the first surface of the semiconductor die electrically coupled to the contact pad; an encapsulant encapsulating the redistribution structure; an opening in the encapsulant above a portion of the redistribution structure; a conductive layer on the sidewalls of the opening in the encapsulant; and a conductive interconnection structure above the portion of the redistribution structure and filling a remaining volume of the opening in the encapsulant not filled by the conductive layer. The conductive layer may be between the conductive interconnection structure and the portion of the redistribution structure. The conductive layer between the conductive interconnection structure and the portion of the redistribution structure may have a convex shape. The conductive layer may be coplanar with a top surface of the encapsulant. The conductive layer may extend above a top surface of the encapsulant and may extend laterally along the top surface of the encapsulant. The conductive interconnection structure may extend laterally beyond the opening in the encapsulant and on the conductive layer that extends laterally along the top surface of the encapsulant. The conductive interconnection structure may extend above a top surface of the encapsulant. A second contact pad may be on the first surface of the semiconductor die with a dielectric layer on the first surface of the semiconductor die, where the dielectric layer partially covers the contact pad and the second contact pad.

Referring to FIGS. 1A to 1F, a method of manufacturing a semiconductor package according to an embodiment of the present disclosure is illustrated. The semiconductor die 110 illustrated in FIGS. 1A to 1F may be in a wafer comprising a plurality of semiconductor die 110. The wafer may be diced into individual semiconductor die in a singulation process. In the following description, in order to avoid inconsistencies of terms and for drawing clarity, the wafer including the plurality of semiconductor die 110 will be referred to a single semiconductor die 110.

FIG. 1A is a cross-sectional view illustrating the forming of a redistribution structure 130. As illustrated in FIG. 1A, the redistribution structure 130 is electrically connected to contact pads 111 of the semiconductor die 110 and may comprise at least one dielectric layer and at least one conductive layer. The semiconductor die 110 has a planar first surface 110a and a planar second surface 110b opposite to the first surface 110a and includes a plurality of contact pads 111 formed on the first surface 110a. In addition, the semiconductor die 110 may comprise a pad dielectric layer 112 formed on the first surface 110a to expose the plurality of contact pads 111 to the outside. The pad dielectric layer 112 may comprise any of a variety of dielectric materials, for example inorganic dielectric material (e.g., $Si_3N_4$, $SiO_2$, SiON, etc.) and/or organic dielectric material (e.g., polyimide (PI), benzocyclobutene (BCB), polybenzoxazole (PBO), bismaleimide triazine (BT), a phenolic resin, epoxy, etc.), but aspects of the present disclosure are not limited thereto. The pad dielectric layer 112 may be formed in any of a variety of manners, for example printing, spin coating, spray coating, sintering, thermal oxidation, physical vapor deposition (PVD), chemical vapor deposition (CVD), plasma vapor deposition, sheet lamination, etc.

In addition, an insulation layer 120 may further be interposed between the semiconductor die 110 and the redistribution structure 130. The insulation layer 120 may be coated to cover all of the plurality of contact pads 111 and the pad dielectric layer 112 formed on the first surface 110a of the semiconductor die 110 by chemical vapor deposition (CVD) or spin coating, followed by patterning to expose the plurality of contact pads 111 to the outside by photolithography and/or laser. In instances where the insulation layer 120 is provided, the redistribution structure 130 may be formed on the insulation layer 120 to be electrically connected to the plurality of contact pads 111 exposed through the insulation layer 120.

The redistribution structure 130, or conductive layer(s) thereof, may be electrically connected to the contact pads 111 and may extend a predetermined length along the first surface 120a of the insulation layer 120. The one or more conductive layers of the redistribution structure 130 may be formed by an electroless plating process for forming a seed layer using gold, silver, nickel, titanium and/or tungsten, an electroplating process for forming a plating layer on a seed layer using copper, and a photolithography process for patterning a plating layer using a photoresist, but aspects of the present disclosure are not limited thereto. For example, the at least one conductive layer of the redistribution structure 130 may be formed or deposited using utilizing any one or more of a variety of processes (e.g., electrolytic plating, electroless plating, chemical vapor deposition (CVD), sputtering or physical vapor deposition (PVD), plasma vapor deposition, printing, etc.) In addition, the at least one conductive layer of the redistribution structure 130 may comprise any of a variety of materials (e.g., copper, aluminum, nickel, iron, silver, gold, titanium, chromium, tungsten, combinations thereof, alloys thereof, etc.), but aspects of the present disclosure are not limited thereto.

The at least one dielectric layer in the redistribution structure 130 may comprise any of a variety of materials, for example inorganic dielectric material (e.g., $Si_3N_4$, $SiO_2$, SiON, oxides, nitrides, etc.) and/or organic dielectric material (e.g., polyimide (PI), benzocyclobutene (BCB), polybenzoxazole (PBO), bismaleimide triazine (BT), a phenolic resin, epoxy, etc.), but aspects of the present disclosure are not limited thereto. The at least one dielectric layer may be formed in any of a variety of manners (e.g., printing, spin coating, spray coating, sintering, thermal oxidation, physical vapor deposition (PVD), chemical vapor deposition (CVD), plasma vapor deposition, sheet lamination, etc.), but aspects of the present disclosure are not limited thereto.

Figure 1B:
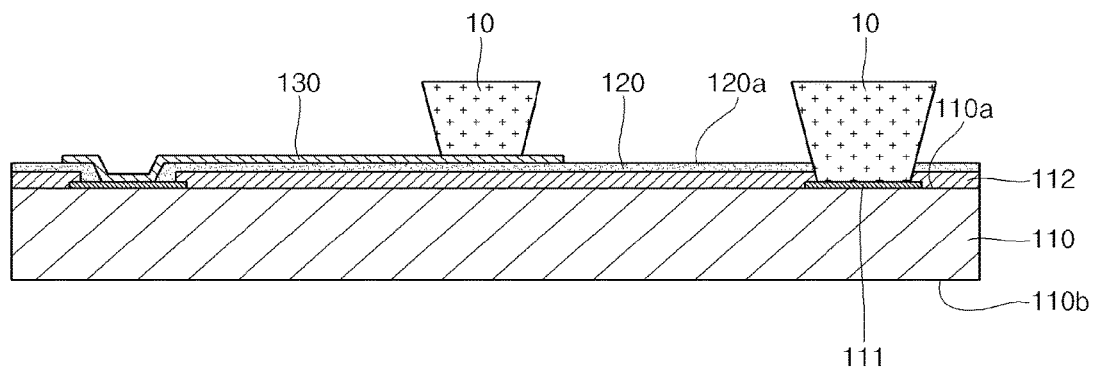

FIG. 1B is a cross-sectional view illustrating the formation of dummy (e.g., temporary) patterns 10. As illustrated in FIG. 1B, the dummy patterns 10 may be formed on the exposed contact pads 111 (e.g., exposed through the pad dielectric layer 112 the insulation layer 120, other layers, etc.) after the insulation layer 120 and the redistribution structure 130 are formed. The dummy patterns 10 may also be formed on regions extending from the redistribution structure 130 along the first surface 120a of the insulation layer 120. The dummy patterns 10 may be formed to have a predetermined thickness. In an example scenario, the thickness may be greater than a thickness of the encapsulant 140 of the semiconductor package 100 (e.g., before or after encapsulant thinning, if performed). As shown in FIG. 1B, the dummy patterns 10 formed on the contact pads 111 may have different dimensions that the dummy patterns formed on the redistribution structure 130, but this is not necessary. For example a dummy pattern 10 formed on a contact pad 111 may be taller than a dummy pattern 10 formed on the redistribution structure 130. Also for example, a dummy pattern 10 formed on a contact pad 111 may have a width (e.g., base width, top width, average width, etc.) that is different from a width of a dummy pattern 10 formed on the redistribution structure 130, or vice versa.

The dummy patterns 10 may comprise a photoresist, but aspects of the present disclosure are not limited thereto. The dummy pattern 10 may be formed in any of a variety of manners, non-limiting examples of which are provided herein. For example, the dummy pattern 10 may be preformed and then placed on the contact pads 111 and redistribution structure 130, the dummy pattern 10 may be formed directly on the contact pads 111 and redistribution structure 130, etc.

Figure 1C:
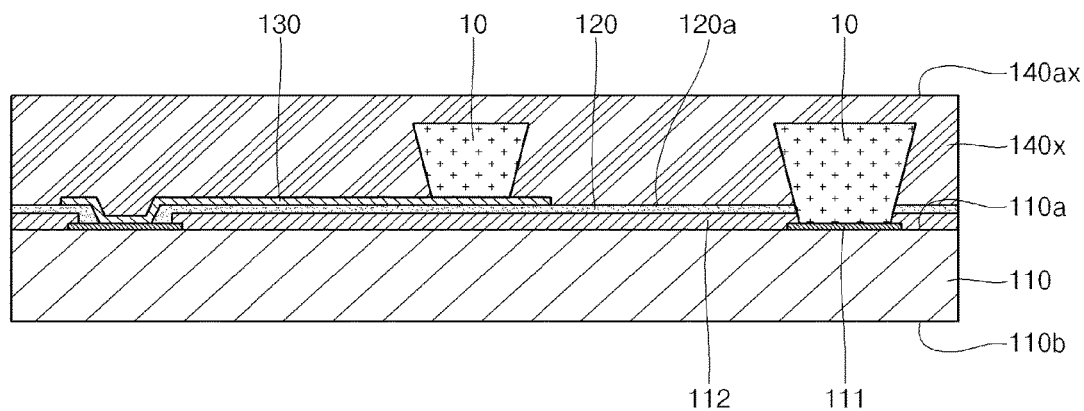

FIG. 1C is a cross-sectional view illustrating the formation of an encapsulant 140x. As illustrated in FIG. 1C, the encapsulant 140x may be formed to cover all of the first surface 120a of the insulation layer 120, the dummy patterns 10 and the redistribution structure 130. The encapsulant 140x may comprise any of a variety of materials (e.g., epoxy molding compound (EMC), resin, polymer, polymer composite material (such as epoxy resin with filler, epoxy acrylate with filler, or polymer with a proper filler), etc.), but the scope of the present disclosure is not limited thereto. The encapsulant 140x may, for example, comprise a thermally curable material. The encapsulant 140x may be formed in any of a variety of manners (e.g., compression molding, transfer molding, liquid encapsulant molding, vacuum lamination, paste printing, film assisted molding, etc.), but the scope of the present disclosure is not limited thereto. As shown in FIG. 1C, the encapsulant 140x may cover the top surfaces of one or more of the dummy patterns 10, but need not.

Figure 1D:
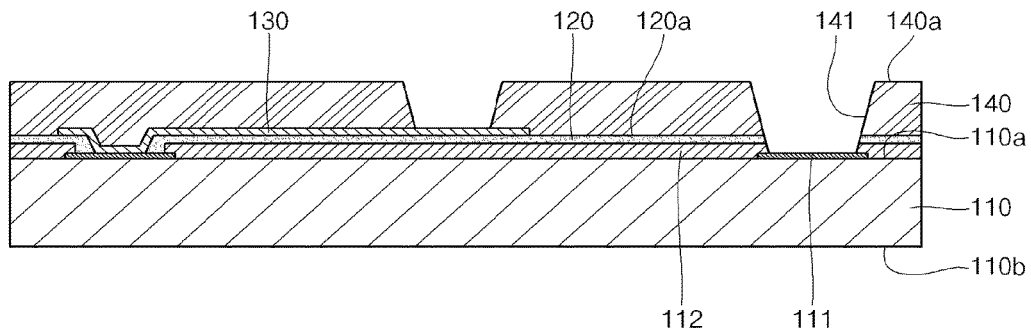

FIG. 1D is a cross-sectional view illustrating the removal of the dummy patterns 10. As illustrated in FIG. 1D, the dummy patterns 10 covered by the encapsulant 140x may first be exposed (if not already exposed) by removing at least a portion of the encapsulant 140x and the exposed dummy patterns 10 may then be removed. The encapsulant 140x may be removed to a predetermined depth from a first surface 140a utilizing a grinding process. In this instance, since the encapsulant 140x is partially removed (e.g., through grinding), it may have a predetermined thickness as desired for the semiconductor package 100. Note that the top sides of the dummy patterns 10 may also be thinned (e.g., ground) along with the encapsulant 140x. After the grinding, the encapsulant 140 has a planar first surface 140a. At this point, the planar first surface 140a may be coplanar with the top surfaces of the dummy patterns 10. Accordingly, the redistribution structure 130 and the contact pads 111 corresponding to the regions where the dummy patterns 10 have been formed may be exposed through the encapsulant 140.

When exposed from the top surface of the encapsulant 140, the dummy patterns 10 may be removed. Such removal may be performed in any of a variety of manners, non-limiting examples of which are provided herein. For example, the dummy patterns 10 may be chemically removed (e.g., by etching, etc.), mechanically removed, etc.

In addition, if the dummy patterns 10 exposed after the grinding (or otherwise thinning) of the encapsulant 140x are removed, the regions where the dummy patterns 10 had been formed are exposed through the first surface 140a of the encapsulant 140. In addition, if the dummy patterns 10 are removed, mold holes 141 through which the redistribution structure 130 and the contact pads 111 are exposed are provided in the encapsulant 140.

Accordingly, the redistribution structure 130 and the contact pads 111 corresponding to the regions where the dummy patterns 10 had been formed may be exposed through the encapsulant 140.

Figure 1E:
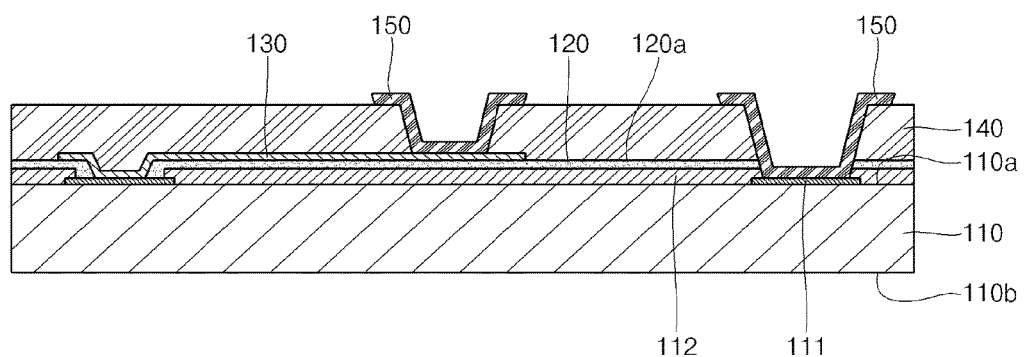

FIG. 1E is a cross-sectional view illustrating the formation of a conductive layer 150. As illustrated in FIG. 1E, the conductive layer 150 may be electrically connected to the redistribution structure 130 and the contact pads 111 exposed through the encapsulant 140. The conductive layer 150 may be formed to cover the inner walls of the mold holes 141 of the encapsulant 140 and a portion of the conductive layer 150 may extend to the first surface 140a of the encapsulant 140. A portion of the conductive layer 150 may also cover a top surface of the encapsulant 140 around a perimeter of the mold hole 141. The conductive layer 150 may be formed to a predetermined thickness.

The conductive layer 150 may comprise one or more layers of any of a variety of conductive materials (e.g., copper, aluminum, nickel, iron, silver, gold, titanium, chromium, tungsten, combinations thereof, alloys thereof, etc.), but aspects of the present disclosure are not limited thereto. The conductive layer 150 may be formed or deposited using utilizing any one or more of a variety of processes (e.g., electrolytic plating, electroless plating, chemical vapor deposition (CVD), sputtering or physical vapor deposition (PVD), plasma vapor deposition, printing, etc.), but aspects of the present disclosure are not limited thereto. In an example implementation, the conductive layer 150 may be formed by plating a seed layer using gold, silver, nickel, titanium and/or tungsten using an electroless plating process, patterning a photoresist to cover regions other than a potential region of the conductive layer 150, and forming a plating layer on the exposed seed layer through the photoresist using copper, but aspects of the present disclosure are not limited thereto.

Figure 1F:
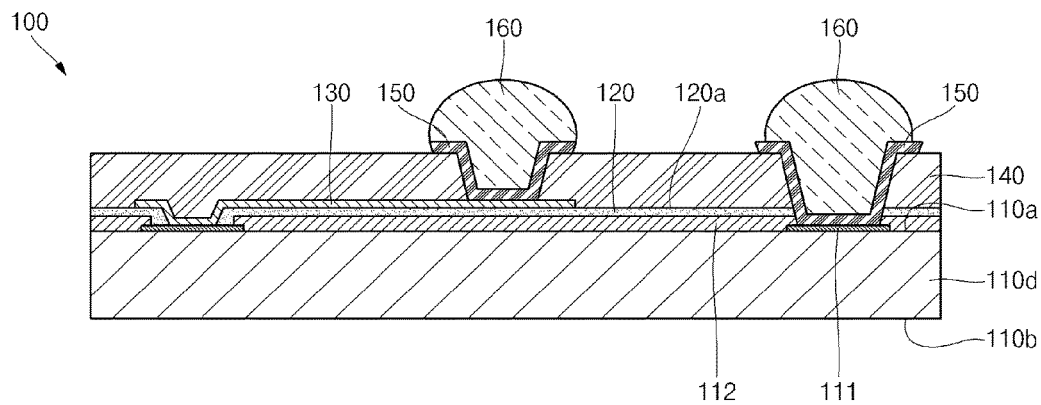

FIG. 1F is a cross-sectional view illustrating the forming of conductive interconnection structures 160. The conductive interconnection structures 160 may, for example, comprise conductive bumps, but the scope of this disclosure is not limited thereto. As illustrated in FIG. 1F, the conductive interconnection structures 160 may be formed on the conductive layer 150 and electrically connected to the conductive layer 150. The conductive interconnection structures 160 may comprise solder bumps or balls, for example, and may comprise tin (Sn)/lead (Pb), leadless tin, or similar materials, but aspects of the present disclosure are not limited thereto. The conductive interconnection structures 160 may be electrically connected to the contact pads 111 of the semiconductor die 110 through the conductive layer 150 and the redistribution structure 130. In addition, the conductive interconnection structures 160 may be electrically connected to the contact pads 111 of the semiconductor die 110 through the conductive layer 150 without the redistribution structure 130. The conductive interconnection structures 160 may comprise input and/or output pads to allow the semiconductor package 100 to be mounted on an external board of an electronic device, to be mounted to another electronic device in a package-on-package configuration, etc.

After the forming of the conductive interconnection structures 160, the semiconductor die 110, the pad dielectric layer 112, the insulation layer 120, and the encapsulant 140 may be diced (or singulated) for separating the wafer into discrete semiconductor packages 100.

The semiconductor package 100 may be formed to have a predetermined thickness, for example as determined by the extent to which the encapsulant 140 is thinned. In addition, the semiconductor package 100 may reduce stress applied to the conductive interconnection structures 160 due to differences of temperatures and thermal expansion coefficients between the conductive interconnection structures 160 and the encapsulant 140 by forming the conductive layer 150 having high adhesion to the conductive interconnection structures 160 and to the inner walls of the encapsulant 140 (e.g., walls of the mold holes 141), thereby improving board level reliability (BLR) of the semiconductor package 100.

Figure 2:
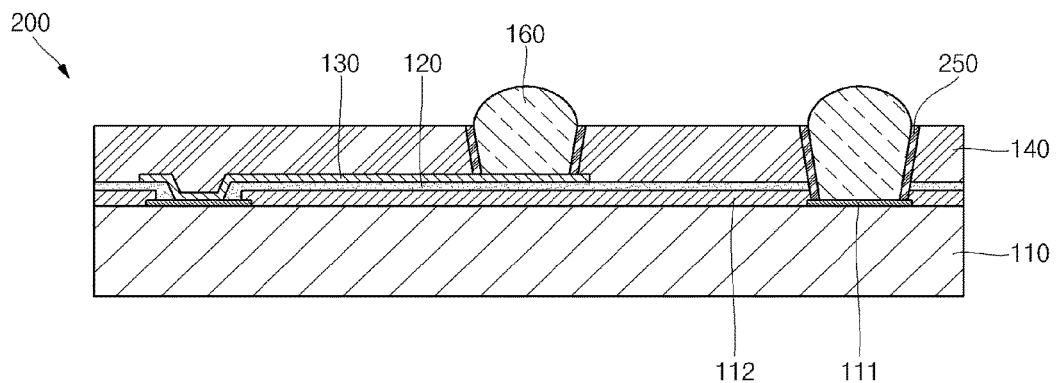
FIG. 2 is a cross-sectional view illustrating a semiconductor package according to another embodiment of the present disclosure.

Referring to FIG. 2, a semiconductor package according to another embodiment of the present disclosure is illustrated. The semiconductor package 200 illustrated in FIG. 2 comprises a semiconductor die 110, an insulation layer 120, a redistribution structure 130, an encapsulant 140 and a conductive layer 250. The semiconductor die 110, the insulation layer 120, the redistribution structure 130, and the encapsulant 140 illustrated in FIG. 2 may be substantially similar to those of the semiconductor package 100 illustrated in FIG. 1F. Therefore, the following description of the semiconductor package 200 will focus on differences between the conductive layer 250 and the conductive layer 150 of the semiconductor package 100 illustrated in FIG. 1F.

The conductive layer 250 may be formed to entirely cover inner walls of mold holes 141 of the encapsulant 140 but not formed to cover the redistribution structure 130 and contact pads 111 exposed through the encapsulant 140, for example formed only on the inner walls of the mold holes 141 of the encapsulant 140. In addition, the conductive layer 250 may be formed along the inner walls of the mold holes 141 and electrically connected to the redistribution structure 130 and the contact pads 111. The conductive layer 250 may be interposed between the encapsulant 140 and the conductive interconnection structures 160 thereby increasing coupling forces between the encapsulant 140 and the conductive interconnection structures 160. In addition, the redistribution structure 130 and the contact pads 111 exposed through the encapsulant 140 may be directly connected to the conductive interconnection structures 160 without separately providing the conductive layer 250.

The semiconductor package 200 may reduce stress applied to the conductive interconnection structures 160 due to differences of temperatures and thermal expansion coefficients between the conductive interconnection structures 160 and the encapsulant 140 by forming the conductive layer 250 having high adhesion to the conductive interconnection structures 160 and to the inner walls of the encapsulant 140 (e.g., walls of the mold holes 141), thereby improving board level reliability (BLR) of the semiconductor package 200.

Referring to FIGS. 3A to 3D, a method of manufacturing a semiconductor package according to another embodiment of the present disclosure is illustrated.

Figure 3A:
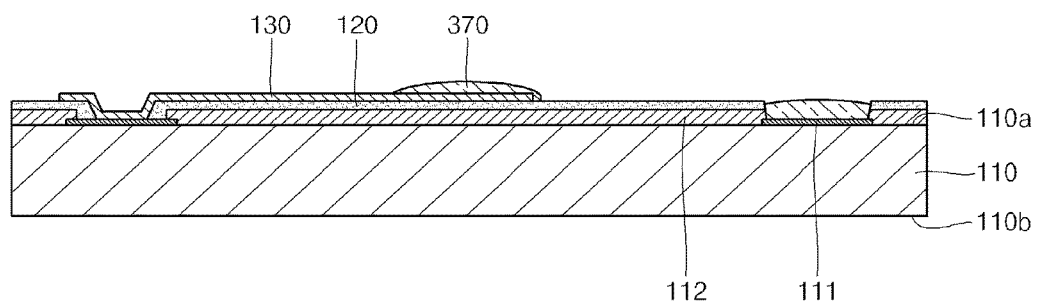
FIGS. 3A to 3D are views illustrating a method of manufacturing a semiconductor package according to another embodiment of the present disclosure.

FIG. 3A is a cross-sectional view illustrating the formation of contact pads 370. Before forming the contact pads 370, in substantially the same manner as illustrated in FIG. 1A, an insulation layer 120 and a redistribution structure 130 may be formed on a semiconductor die 110. As illustrated in FIG. 3A, the contact pads 370 are formed on a plurality of exposed contact pads 111 after the forming of the redistribution structure 130 and the insulation layer 120. In an example scenario, the contact pads may comprise a convex shape with the thickest region being essentially centered.

The contact pads 370 may be formed on a region extending from the redistribution structure 130 along a first surface 120a of the insulation layer 120. In addition, the contact pads 370 may be formed to cover an end of the region extending from the redistribution structure 130 along the first surface 120a of the insulation layer 120. Further, the contact pads 370 may be formed to cover the plurality of contact pads 111 exposed through the insulation layer 120. The contact pads 370 may be formed by one of a general ball drop method, an ink jet method, screen printing, or similar processes, but aspects of the present disclosure are not limited thereto. The contact pads 370 and the conductive interconnection structures 160 may comprise same material.

Figure 3B:
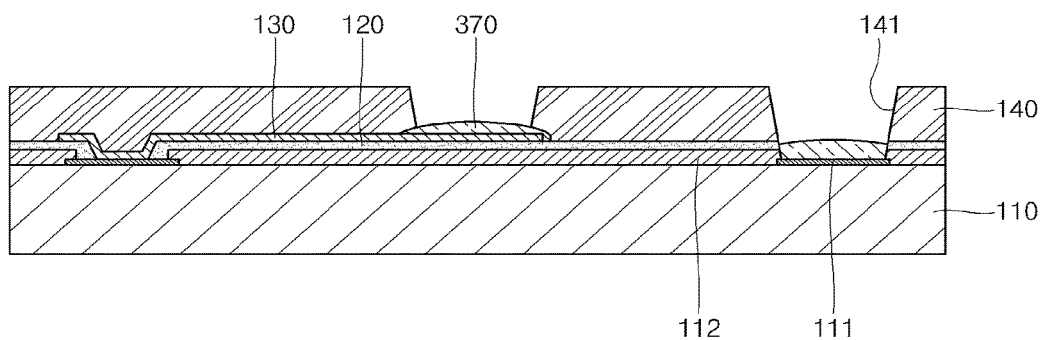

FIG. 3B is a cross-sectional view illustrating the formation of an encapsulant 140. As illustrated in FIG. 3B, the encapsulant 140 may be formed to cover both the first surface 120a of the insulation layer 120 and the redistribution structure 130. The contact pads 370 may be exposed by mold holes 141 provided in the encapsulant 140. The contact pads 370 at the end of the redistribution structure 130 may be covered by the encapsulant 140 such that only some of the contact pads 370 are exposed through the mold holes 141, and the remaining region may be interposed between the encapsulant 140 and the insulation layer 120. In substantially the same manner as illustrated in FIGS. 1B to 1D, the encapsulant 140 may be formed after dummy patterns 10 are formed, followed by the removal of the dummy patterns 10 exposed through grinding, which thereby exposes the contact pads 370 through the mold holes 141. In an example implementation, such dummy patterns 110 may have contoured (or formable) lower surfaces that match the contour of the contact pads 370. Alternatively, the encapsulant 140 may be formed to cover all of the first surface 120a of the insulation layer 120, the contact pads 370 and the redistribution structure 130, and mold holes 141 may be formed in the encapsulant 140 using laser ablation, mechanical ablation, etching, etc., for example, thereby exposing the contact pads 370. The encapsulant 140 may comprise an epoxy molding compound (EMC) that is a thermally curable material, for example.

Figure 3C:
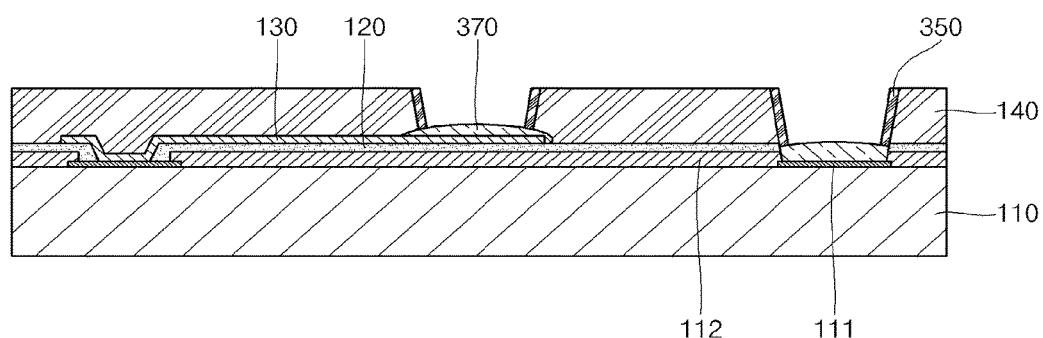

FIG. 3C is a cross-sectional view illustrating the forming of a conductive layer 350. As illustrated in FIG. 3C, the conductive layer 350 may be formed to cover all of inner walls of the mold holes 141 of the encapsulant 140. In this example scenario, the conductive layer 350 is not formed on the contact pads 370 exposed through the encapsulant 140 but only on the inner walls of the mold holes 141 of the encapsulant 140. For example, as with the example conductive layer 250 of FIG. 2 and different from the conductive layer 150 of FIG. 1E, the conductive layer 350 may be formed to entirely cover inner walls of the mold holes 141 but not formed to cover the encapsulant 140. In addition, the conductive layer 350 may be electrically connected to the contact pads 370 along the inner walls of the mold holes 141. The conductive layer 350 and/or the formation thereof may, for example, share any or all characteristics with the conductive layers 150 and 250 and/or the formation thereof. The conductive layer 350 may, for example, be formed to have a predetermined thickness and may be formed by forming a seed layer comprising gold, silver, nickel, titanium and/or tungsten using an electroless plating process, patterning a photoresist to cover regions other than a potential region of the conductive layer 350 and forming a copper plating layer on the seed layer exposed through the photoresist, but aspects of the present disclosure are not limited thereto.

Figure 3D:
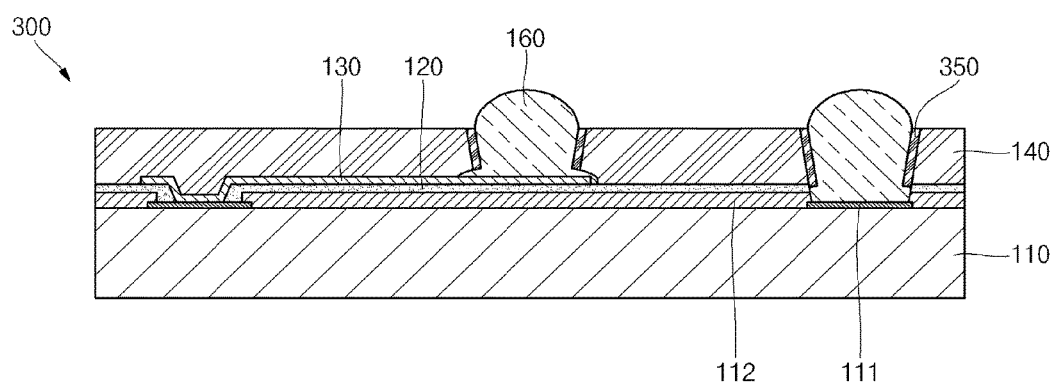

FIG. 3D is a cross-sectional view illustrating the formation of conductive interconnection structures 160. As illustrated in FIG. 3D, the conductive interconnection structures 160 may be formed on the contact pads 370 exposed through the encapsulant 140 that are then electrically connected to the contact pads 370. The conductive interconnection structures 160 may be formed to completely fill the mold holes 141 of the encapsulant 140. In the illustrated embodiment, the interconnection structures 160 are not formed on the top surface of the conductive layer 350, but the scope of this disclosure is not limited thereto. The conductive layer 350 is interposed between the encapsulant 140 and the conductive interconnection structures 160, thereby increasing coupling forces between the encapsulant 140 and the conductive interconnection structures 160. In addition, the contact pads 370 exposed through the encapsulant 140 may make direct contact with the conductive interconnection structures 160.

The conductive interconnection structures 160 may comprise input and/or output pads to allow the semiconductor package 300 to be mounted on an external board of an electronic device, to be mounted to another electronic device in a package-on-package configuration, etc. The conductive interconnection structures 160 may comprise solder bumps or balls, for example, and may comprise tin (Sn)/lead (Pb), leadless tin, or similar materials, but aspects of the present disclosure are not limited thereto. The conductive interconnection structures 160 may be formed by temporarily mounting the conductive interconnection structures 160 on the contact pads 370, followed by performing a high-temperature reflow process, thereby fusing the conductive interconnection structures 160 and the contact pads 370 to be integrally formed and to be electrically and mechanically connected to the redistribution structure 130 or the contact pads 111.

After the conductive interconnection structures 160 are formed, the semiconductor die 110, the pad dielectric layer 112, the insulation layer 120 and the encapsulant 140 may be diced (or singulated) for separating the wafer into discrete semiconductor packages 300.

The semiconductor package 300 may reduce stress applied to the conductive interconnection structures 160 due to differences of temperatures and thermal expansion coefficients between the conductive interconnection structures 160 and the encapsulant 140 using the conductive layer 350 having high adhesion to the conductive interconnection structures 160 and to the inner walls of the encapsulant 140 (e.g., walls of the mold holes 141), thereby improving board level reliability (BLR) of the semiconductor package 300.

Referring to FIGS. 4A to 4G, a manufacturing method of a semiconductor package according to still another embodiment of the present disclosure is illustrated.

Figure 4A:
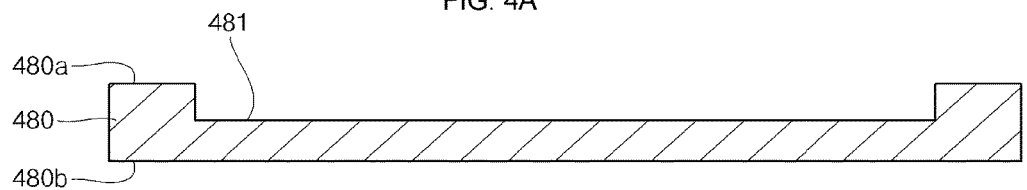

FIG. 4A is a cross-sectional view illustrating the preparation of a carrier 480. As illustrated in FIG. 4A, the carrier 480 has a planar first surface 480a and a planar second surface 480b opposite to the first surface 480a and includes a die mounting portion 481, or cavity, formed in the first surface 480a. The die mounting portion 481 therefore comprises an inwardly concave groove formed in the first surface 480a of the carrier 480. The carrier 480 may comprise an epoxy molding compound (EMC), for example, that is a thermally curable material, though the scope of this disclosure is not limited thereto. For example, the carrier 480 may comprise any of a variety of organic and/or inorganic materials, non-limiting examples of which are provided herein, etc.

Figure 4B:
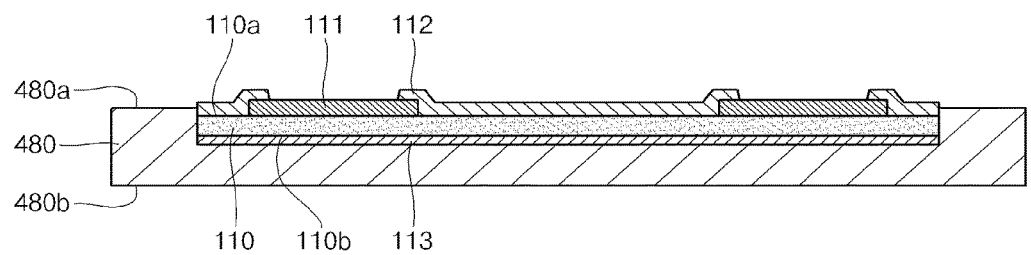

FIG. 4B is a cross-sectional view illustrating the mounting of a semiconductor die 110. As illustrated in FIG. 4B, the semiconductor die 110 may be mounted on the die mounting portion 481 of the carrier 480. The semiconductor die 110 comprises a planar first surface 110a and a planar second surface 110b opposite to the first surface 110a and comprises a plurality of contact pads 111 formed on the first surface 110a. In addition, the semiconductor die 110 may comprise a pad dielectric layer 112 formed on the first surface 110a to expose the plurality of contact pads 111. The pad dielectric layer 112 may comprise any of a variety of dielectric materials, for example inorganic dielectric material (e.g., $Si_3N_4$, $SiO_2$, SiON, etc.) and/or organic dielectric material (e.g., polyimide (PI), benzocyclobutene (BCB), polybenzoxazole (PBO), bismaleimide triazine (BT), a phenolic resin, epoxy, etc.), but aspects of the present disclosure are not limited thereto. The pad dielectric layer 112 may be formed in any of a variety of manners, for example printing, spin coating, spray coating, sintering, thermal oxidation, physical vapor deposition (PVD), chemical vapor deposition (CVD), plasma vapor deposition, sheet lamination, etc.

A thickness of the semiconductor die 110 corresponding to a distance between the first surface 110a and the second surface 110b may be 50 µm or less. Therefore, the semiconductor die 110 having a small thickness may be mounted on the carrier 480 made of a curable material, thereby facilitating handling of the semiconductor die 110.

In addition, though not shown, in substantially the same manner as illustrated in FIG. 1A, a redistribution structure 130 electrically connected to one or more of the contact pads 111 and an insulation layer 120 interposed between the redistribution structure 130 and the pad dielectric layer 112 may be formed on the semiconductor die 110.

Figure 4C:
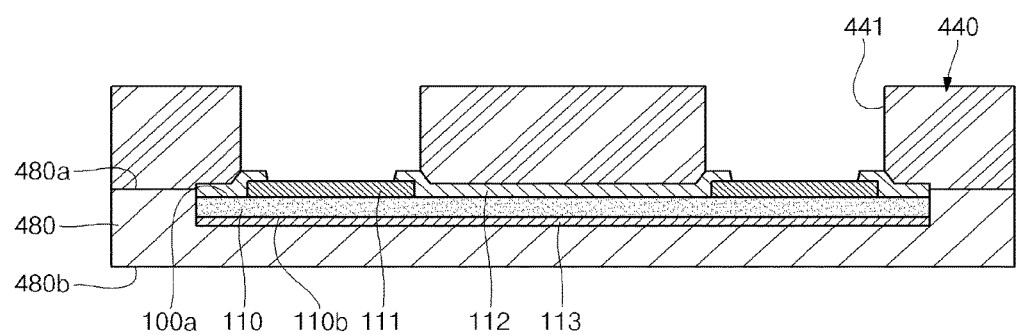

FIG. 4C is a cross-sectional view illustrating the formation of an encapsulant 440. The encapsulant 440 and the forming thereof may share any or all characteristics with other encapsulants and the forming thereof, discussed herein. As illustrated in FIG. 4C, the encapsulant 440 may entirely cover a pad dielectric layer 112 of the semiconductor die 110, for example except for a portion of the pad dielectric layer 112 that covers the contact pads. Alternatively, the encapsulant 440 may entirely cover at least a top side (and/or edges) of the pad dielectric layer 112. The contact pads 111 of the semiconductor die 110 may be exposed through mold holes 441 provided in the encapsulant 440. In substantially the same manner as illustrated in FIGS. 1B to 1D, the encapsulant 440 may be formed after dummy patterns 10 are formed, followed by removal of the dummy patterns 10 exposed through grinding, which thereby exposes the contact pads 111 through the mold holes 441. Alternatively, the encapsulant 440 may cover all of the pad dielectric layer 112 and the contact pads 111, and mold holes 441 may be formed in the encapsulant 440 using laser ablation, mechanical ablation, etching, etc., for example, thereby exposing the contact pads 111. The encapsulant 440 may comprise an epoxy molding compound (EMC), for example, one that is a thermally curable material.

Figure 4D:
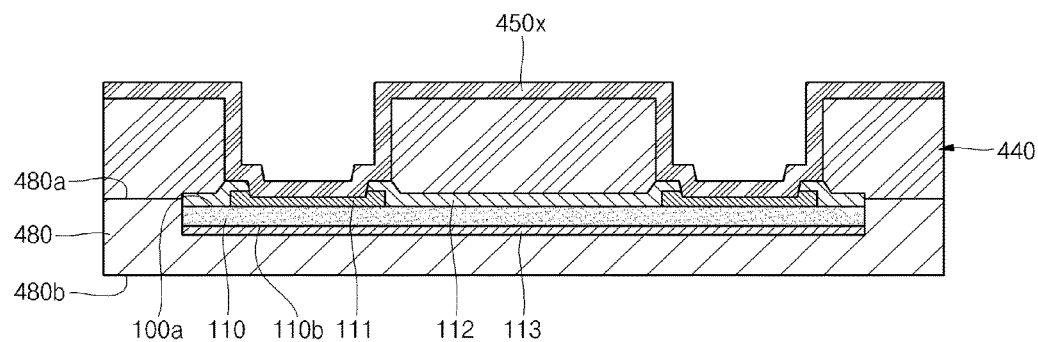

FIG. 4D is a cross-sectional view illustrating the formation of a conductive layer 450x. As illustrated in FIG. 4D, the conductive layer 450x may be electrically connected to the contact pads 111 exposed through the encapsulant 440. In addition, the conductive layer 450x may be cover the inner walls of the mold holes 441 of the encapsulant 440 and a first surface 440a of the encapsulant 440. The conductive layer 450x may be formed with a predetermined thickness. The conductive layer 450x and/or the forming thereof may share any or all characteristics with other conductive layers and/or the forming thereof discussed herein. The conductive layer 450x may be formed using a seed layer comprising gold, silver, nickel, titanium and/or tungsten, for example, by an electroless plating process, and a plating layer may be formed on the seed layer using copper in an electroplating process, for example, but aspects of the present disclosure are not limited thereto.

FIG. 4E is a cross-sectional view illustrating the formation of conductive interconnection structures 470x. As illustrated in FIG. 4E, the conductive interconnection structures 470x may be formed to entirely fill the mold holes 441 of the encapsulant 440 having the conductive layer 450x. The conductive interconnection structures 470x and/or the forming thereof may share any or all characteristics with the other interconnections structures and/or the forming thereof, discussed herein. The conductive interconnection structures 470x may be formed by filling the mold holes 441 having the conductive layer 450x with conductive paste using a squeegee, for example, and curing by thermal treatment. In other embodiments, the conductive interconnection structures 470x may be formed using a general ball drop method, screen printing, electroplating, vacuum evaporation, plating, or similar processes, for example, but aspects of the present disclosure are not limited thereto.

FIG. 4F is a cross-sectional view illustrating the removal of portions of the conductive interconnection structures 470x and/or the conductive layer 450x. As illustrated in FIG. 4F, the portion of the conductive interconnection structures 470x and the conductive layer 450x above the first surface 440a of the encapsulant 440 may be removed. Note that a portion of the encapsulant 440 (along with laterally adjacent conductive interconnection structure 470x and conductive layer 450x portions) may also be removed. The removal of portions of the conductive interconnection structures 470x and the conductive layer 450x may be performed by etching or grinding, for example, but aspects of the present disclosure are not limited thereto. For example, when the conductive interconnection structures 470x and the conductive layer 450x are removed by grinding, the layers may be removed by grinding until the first surface 440a of the encapsulant 440 is exposed. In this scenario, the exposed surfaces of the conductive interconnection structures 470, the conductive layer 450, and the first surface 440a of the encapsulant 440 may be coplanar.

In instances where the conductive interconnection structures 470x and the conductive layer 450x are removed by etching, the layers may be etched until the exposed surfaces of the conductive interconnection structures 470 and the first surface 440a of the encapsulant 440 are coplanar. As a result of removing the portion of the conductive layer 450x above the first surface 440a of the encapsulant 440, a discrete conductive interconnection structure 470 formed in each of the mold holes 441 may be electrically separated from other conductive interconnection structures 470. In this scenario, the conductive layer 450 may be interposed between the encapsulant 440 and the conductive interconnection structures 470, thereby increasing adhesion between the encapsulant 140 and the conductive interconnection structures 470.

FIG. 4G is a cross-sectional view illustrating the formation of conductive interconnection structures 460 (e.g., conductive balls, conductive bumps, etc.). As illustrated in FIG. 4G, the conductive interconnection structures 460 may be formed on the conductive interconnection structures 470 and electrically connected to the conductive interconnection structures 470. The conductive interconnection structures 460 may be electrically connected to the contact pads 111 of the semiconductor die 110 through the conductive interconnection structures 470 and the conductive layer 450. The conductive interconnection structures 460 to be mounted to another electronic device in a package-on-package configuration, for example, comprise input and/or output pads to allow the semiconductor package 400 to be mounted on an external board of an electronic device. The conductive interconnection structures 460 to be mounted to another electronic device in a package-on-package configuration may comprise the same material as the conductive interconnection structures 470, but aspects of the present disclosure are not limited thereto. The conductive interconnection structures 460 may be formed by temporarily mounting the conductive interconnection structures 460 (e.g., conductive balls, conductive bumps, etc.) on the conductive interconnection structures 470, followed by a high-temperature reflow process, thereby fusing the conductive interconnection structures 460 and the conductive interconnection structures 470 to be integrally formed and to be electrically connected to the contact pads 111 of the semiconductor die 110 through the conductive layer 450.

After the conductive interconnection structures 460 are formed, the semiconductor die 110, the pad dielectric layer 112, and the encapsulant 140 may be diced for separating the wafer into discrete semiconductor packages 400.

The semiconductor package 400 may reduce stress (or prevent cracks) that may be generated between different materials, that is, between the encapsulant 440 and the conductive interconnection structures 470 or between the encapsulant 440 and the conductive interconnection structures 460, by forming the conductive layer 450 having high adhesion to the conductive interconnection structures 460, to the inner walls of the encapsulant 440 (e.g., walls of the mold holes 141), and/or to the conductive interconnection structures 470. Accordingly, board level reliability (BLR) of the semiconductor package 400 may be improved. Furthermore, the carrier 480 enables the handling of the semiconductor die, particularly in cases where the die is too thin to handle alone and also protects the die from environment stress or shock.

Figure 5:
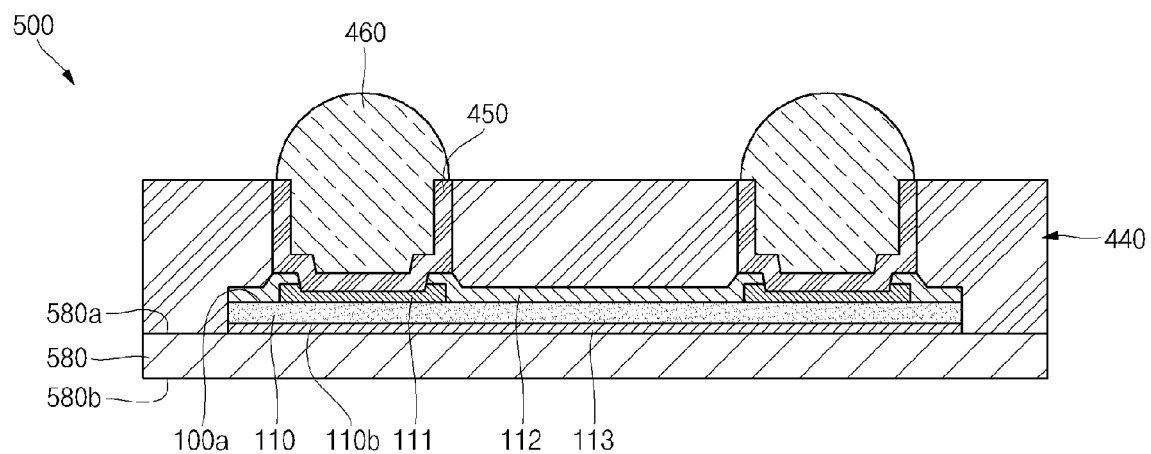
FIG. 5 is a cross-sectional view illustrating a semiconductor package according to still another embodiment of the present disclosure.

Referring to FIG. 5, a semiconductor package according to still another embodiment of the present disclosure is illustrated. The semiconductor package 500 illustrated in FIG. 5 comprises a carrier 580, a semiconductor die 110, an encapsulant 440, a conductive layer 450, conductive interconnection structures 470 and conductive interconnection structures 460. The semiconductor die 110, the encapsulant 440, the conductive layer 450, the conductive interconnection structures 470 and the conductive interconnection structures 460 of the semiconductor package 500 illustrated in FIG. 5 may be substantially similar as those of the semiconductor package 400 illustrated in FIG. 4G. Therefore, the following description of the semiconductor package 500 will focus on the differences between the carrier 580 and the carrier 480 of the semiconductor package 400 illustrated in FIG. 4G.

The carrier 580 has a planar first surface 580a and a planar second surface 580b opposite to the first surface 580a. In addition, a semiconductor die 110 may be mounted on the first surface 580a of the carrier 580, where a second surface 110b of the semiconductor die 110 may be adhered to the first surface 580a of the carrier 580 using an adhesive 113. The adhesive 113 may comprise a general liquid epoxy adhesive, an adhesive film, an adhesive tape, or similar material, but aspects of the present disclosure are not limited thereto. The carrier 580 may comprise an epoxy molding compound (EMC), for example, one that is a thermally curable material, though the scope of this disclosure is not limited thereto. For example, the carrier 480 may comprise any of a variety of organic and/or inorganic materials, non-limiting examples of which are provided herein, etc.

A thickness of the semiconductor die 110, corresponding to a distance between the first surface 110a and the second surface 110b, may be 50 μm or less. In this manner, the semiconductor die 110 having a relatively small thickness may be mounted on the carrier 580, thereby facilitating handling of the semiconductor package 500.

The present disclosure may also, for example, provide a semiconductor device 500, which has improved heat radiating performance by completely exposing the top and side surfaces of the first semiconductor die 150 (e.g., after removal from the carrier 580, if removed).

The present disclosure provides a semiconductor package using a contact in a plated sidewall encapsulant opening and may comprise a semiconductor die comprising a first surface with a first contact pad and a second surface opposite the first surface; a redistribution structure on the first surface of the semiconductor die electrically coupled to the first contact pad; a second contact pad on the redistribution structure; an encapsulant encapsulating the redistribution structure and a portion of the second contact pad; an opening in the encapsulant above a portion of the second contact pad; a conductive layer on the sidewalls of the opening in the encapsulant and in contact with the second contact pad; and a conductive interconnection structure on the second contact pad and filling a remaining volume of the opening in the encapsulant not filled by the conductive layer. The second contact pad may have a convex shape.

The conductive layer may be coplanar with a top surface of the encapsulant. The conductive interconnection structure may extend above a top surface of the encapsulant. A third contact pad may be on the first surface of the semiconductor die with a dielectric layer on the first surface of the semiconductor die, where the dielectric layer partially covers the second contact pad and the third contact pad. The redistribution structure may comprise at least one conductive layer and at least one dielectric layer. The opening in the encapsulant may comprise sloped sidewalls. The second contact pad may extend laterally beyond the opening in the encapsulant.

The present disclosure provides a semiconductor package and a manufacturing method thereof, which may reduce stress applied to interconnection structures (e.g., solder balls, bumps, etc.) due to differences of temperatures and thermal expansion coefficients between the interconnection structures and an encapsulant by forming a highly adhesive conductive layer between the encapsulant and the interconnection structures.

According to an aspect of the present disclosure, there is provided a semiconductor package including forming an encapsulant to cover a semiconductor die including a plurality of bond pads formed on its first surface and exposing the bond pads to the outside through mold holes provided in the encapsulant, forming a conductive layer on inner walls of the mold holes provided in the encapsulant, and forming interconnection structures (e.g., conductive balls, conductive bumps, etc.) to completely fill the mold holes having the conductive layer, wherein the conductive interconnection structures are electrically connected to the bond pads.

According to another aspect of the present disclosure, there is provided a semiconductor package including a semiconductor die including a plurality of bond pads on its first surface, an encapsulant formed to cover the first surface of the semiconductor die and including mold holes exposing the bond pads of the semiconductor die to the outside, a conductive layer formed to cover inner walls of the mold holes of the encapsulant, and conductive interconnection structures formed to completely fill the mold holes having the conductive layer, wherein the conductive layer is interposed between the conductive interconnection structures and the encapsulant.

According to still another aspect of the present disclosure, there is provided a manufacturing method of a semiconductor package, where the manufacturing method includes forming an encapsulant to cover a semiconductor die including a plurality of bond pads formed on its first surface and exposing the bond pads through mold holes formed from the first surface of the encapsulant to the semiconductor die, forming a conductive layer having a predetermined thickness to cover the first surface of the encapsulant and the bond pads and the mold holes exposed through the mold holes, forming conductive interconnection structures to completely fill the mold holes having the conductive layer, removing the conductive layer formed on the first surface of the encapsulant to expose the first surface of the encapsulant, and forming conductive interconnection structures to be electrically connected to the solder interconnection structures.

As described above, in the semiconductor package and the manufacturing method thereof according to the present disclosure, stress applied to conductive interconnection structures (e.g., conductive balls, conductive bumps, etc.) due to differences of temperatures and thermal expansion coefficients between the conductive interconnection structures and an encapsulant can be reduced by forming a highly adhesive conductive layer between the encapsulant and the conductive interconnection structures.

In addition, in the semiconductor package and the manufacturing method thereof according to the present disclosure, the encapsulant is removed by grinding, thereby making the encapsulant have a uniform thickness as demanded by the semiconductor package.

Further, in the semiconductor package and the manufacturing method thereof according to the present disclosure, a semiconductor die having a relatively small thickness is mounted on a carrier made of a curable material, thereby facilitating handling of the semiconductor package.

While various aspects supporting the disclosure have been described with reference to certain example embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular example embodiments disclosed, but that the present disclosure will include all embodiments falling within the scope of the appended claims.

What is claimed is:
1. A semiconductor device comprising:
  a semiconductor die comprising a first surface with a contact pad and a second surface opposite the first surface;
  a redistribution structure on the first surface of the semiconductor die electrically coupled to the contact pad;
  an encapsulant encapsulating the redistribution structure;
  an opening in the encapsulant above a portion of the redistribution structure, wherein sidewalls of the opening are substantially vertical;
  a conductive layer on the sidewalls of the opening in the encapsulant and on the contact pad, wherein the conductive layer forms a step shape when transitioning from the sidewalls to the contact pad; and a conductive interconnection structure above the portion of the redistribution structure and filling a remaining volume of the opening in the encapsulant not filled by the conductive layer.

2. The semiconductor device according to claim 1, wherein the conductive layer comprises a seed layer and at least one more metal layer plated on the seed layer.

3. The semiconductor device according to claim 1, wherein the conductive layer between the conductive interconnection structure and the portion of the redistribution structure has a convex shape.

4. The semiconductor device according to claim 1, wherein the conductive layer is coplanar with a top surface of the encapsulant.

5. The semiconductor device according to claim 1, wherein the conductive layer extends above a top surface of the encapsulant and extends laterally along the top surface of the encapsulant.

6. The semiconductor device according to claim 5, wherein the conductive interconnection structure extends laterally beyond the opening in the encapsulant and on the conductive layer that extends laterally along the top surface of the encapsulant.

7. The semiconductor device according to claim 1, wherein the conductive interconnection structure extends above a top surface of the encapsulant.

8. The semiconductor device according to claim 1, comprising a second contact pad on the first surface of the semiconductor die with a dielectric layer on the first surface of the semiconductor die, the dielectric layer partially covering the contact pad and the second contact pad.

9. A semiconductor device comprising:
a semiconductor die comprising a first surface with a first contact pad and a second surface opposite the first surface;
a redistribution structure on the first surface of the semiconductor die electrically coupled to the first contact pad;
a second contact pad on the redistribution structure;
an encapsulant encapsulating the redistribution structure and a portion of the second contact pad;
an opening in the encapsulant above a portion of the second contact pad, wherein sidewalls of the opening are substantially vertical;
a conductive layer on the sidewalls of the opening in the encapsulant and in contact with the second contact pad, wherein the conductive layer forms a step shape when transitioning from the sidewalls to the second contact pad; and
a conductive interconnection structure on the second contact pad and filling a remaining volume of the opening in the encapsulant not filled by the conductive layer.

10. The semiconductor device of claim 9, wherein the second contact pad has a convex shape.

11. The semiconductor device of claim 9, wherein the conductive layer is coplanar with a top surface of the encapsulant.

12. The semiconductor device of claim 9, wherein the conductive interconnection structure extends above a top surface of the encapsulant.

13. The semiconductor device of claim 9, comprising a third contact pad on the first surface of the semiconductor die with a dielectric layer on the first surface of the semiconductor die, the dielectric layer partially covering the second contact pad and the third contact pad.

14. The semiconductor device of claim 9, wherein the redistribution structure comprises at least one conductive layer and at least one dielectric layer.

15. The semiconductor device of claim 9, wherein the opening in the encapsulant comprises sloped sidewalls.

16. The semiconductor device of claim 9, wherein the conductive layer comprises a seed layer and at least one more metal layer plated on the seed layer.

17. A method of fabricating a semiconductor device, the method comprising:
providing a semiconductor die comprising a first surface with a contact pad and a second surface opposite the first surface;
forming a redistribution structure on the first surface of the semiconductor die electrically coupled to the contact pad;
encapsulating the redistribution structure utilizing an encapsulant;
forming an opening in the encapsulant above a portion of the redistribution structure wherein sidewalls of the opening are substantially vertical;
forming a conductive layer on the sidewalls of the opening in the encapsulant and on the contact pad, wherein the conductive layer forms a step shape when transitioning from the sidewalls to the contact pad; and
placing a conductive interconnection structure above the portion of the redistribution structure, the conductive interconnection structure filling a remaining volume of the opening in the encapsulant not filled by the conductive layer.

18. The method of claim 17, comprising thinning the encapsulant such that a top surface of the conductive interconnection structure is coplanar with a top surface of the encapsulant.

19. The method of claim 17, forming the conductive layer on a top surface of the encapsulant.

20. The method of claim 17, comprising forming a dielectric layer on the first surface of the first semiconductor die and a portion of the contact pad before encapsulating the redistribution structure.

21. The semiconductor device of claim 1, wherein a lower surface of a bottom-most portion of the conductive layer is below an upper surface of the contact pad.

* * * * *